US009893715B2

(12) United States Patent
Zachara

(10) Patent No.: US 9,893,715 B2
(45) Date of Patent: Feb. 13, 2018

(54) ADAPTIVE SELF-TUNABLE ANTENNA SYSTEM AND METHOD

(71) Applicant: Shure Acquisition Holdings, Inc., Niles, IL (US)

(72) Inventor: Christopher Zachara, Lake Bluff, IL (US)

(73) Assignee: Shure Acquisition Holdings, Inc., Niles, IL (US)

(*) Notice: Subject to any disclaimer, the term of this patent is extended or adjusted under 35 U.S.C. 154(b) by 0 days.

(21) Appl. No.: 14/100,716

(22) Filed: Dec. 9, 2013

(65) Prior Publication Data
US 2015/0162897 A1    Jun. 11, 2015

(51) Int. Cl.
*H03J 3/02* (2006.01)
*H04B 7/02* (2017.01)
(Continued)

(52) U.S. Cl.
CPC ............... *H03J 3/02* (2013.01); *H01Q 1/22* (2013.01); *H01Q 9/145* (2013.01); *H01Q 21/28* (2013.01); *H04R 2420/07* (2013.01)

(58) Field of Classification Search
USPC ... 455/77, 575.5, 575.6, 101, 107, 120, 121, 455/269, 63.1, 63.4, 67.11, 73, 562.1,
(Continued)

(56) References Cited

U.S. PATENT DOCUMENTS 3,209,358 A    9/1965  Felsenheld
3,623,113 A    11/1971 Falgen et al.
(Continued)

FOREIGN PATENT DOCUMENTS

KR    2005053929    *  6/2005    ............ H01Q 11/08
WO    1988008645 A1    11/1988

OTHER PUBLICATIONS

International Search Report and Written Opinion for PCT/US2014/069238 dated Mar. 12, 2015.
(Continued)

*Primary Examiner* — Edward Urban
*Assistant Examiner* — Ralph H Justus
(74) *Attorney, Agent, or Firm* — William J. Lenz, Esq.; Neal, Gerber & Eisenberg LLP

(57) ABSTRACT

Adaptive self-tunable antenna systems and methods are provided including a closed-loop system for sensing near-field RF signals of transmitted RF signals and tuning an antenna or switching between multiple antennas, so that the strength of the transmitted RF signals is maximized. A sensing antenna detects the near-field RF signal, which is filtered and converted to an RF strength control signal that can be used to generate an antenna tuning control signal. An antenna tuner uses the antenna tuning control signal to keep the antenna in resonance by dynamically changing the electrical length of the antenna or switching between multiple antennas to maximize the strength of the radiated RF signal. Such antennas may be less prone to detuning due to interaction with human bodies or other objects. Dynamically matching the antennas to an RF power amplifier and low noise amplifier can improve stability, power efficiency, gain, noise figure, and receiver sensitivity.

28 Claims, 11 Drawing Sheets

(51) Int. Cl.
*H01Q 1/22* (2006.01)
*H01Q 9/14* (2006.01)
*H01Q 21/28* (2006.01)

(58) Field of Classification Search
USPC ..................................... 455/115.1, 126, 129
See application file for complete search history.

(56) References Cited

U.S. PATENT DOCUMENTS

| | | |
|---|---|---|
| 4,163,981 A | 8/1979 | Wilson |
| 4,169,267 A | 9/1979 | Wong et al. |
| 4,201,990 A | 5/1980 | Altmayer |
| 4,697,192 A | 9/1987 | Hofer et al. |
| 4,730,195 A | 3/1988 | Phillips et al. |
| 4,772,895 A | 9/1988 | Garay et al. |
| 4,800,395 A | 1/1989 | Balzano et al. |
| 4,924,238 A | 5/1990 | Ploussios |
| 5,146,235 A | 9/1992 | Frese |
| 5,301,358 A | 4/1994 | Gaskill et al. |
| 5,329,287 A | 7/1994 | Strickland |
| 5,353,040 A | 10/1994 | Yamada et al. |
| 5,479,182 A | 12/1995 | Sydor |
| 5,668,559 A | 9/1997 | Baro |
| 5,717,368 A | 2/1998 | Niiranen |
| 5,892,480 A | 4/1999 | Killen |
| 5,910,790 A | 6/1999 | Ohmuro et al. |
| 6,011,964 A | 1/2000 | Saitoh |
| 6,166,694 A | 12/2000 | Ying |
| 6,169,523 B1 | 1/2001 | Ploussios |
| 6,172,655 B1 | 1/2001 | Volman |
| 6,353,443 B1 | 3/2002 | Ying |
| 6,917,790 B1* | 7/2005 | Braun .................... H01Q 1/242 455/101 |
| 7,126,557 B2 | 10/2006 | Warnagiris |
| 7,408,517 B1 | 8/2008 | Poilasne et al. |
| 8,140,033 B2* | 3/2012 | Chan Wai Po ........... H03F 1/56 455/115.1 |
| 8,219,157 B2* | 7/2012 | Lum ...................... H01Q 21/28 455/553.1 |
| 2003/0080904 A1 | 5/2003 | Chen |
| 2004/0180633 A1* | 9/2004 | Nakatani ................ H04B 1/525 455/103 |
| 2006/0281423 A1* | 12/2006 | Caimi .................... H01Q 9/045 455/129 |
| 2006/0293097 A1* | 12/2006 | Shimizu ................. H01Q 1/242 455/575.7 |
| 2007/0285326 A1* | 12/2007 | McKinzie ............. H01Q 9/0407 343/746 |
| 2008/0055164 A1 | 3/2008 | Zhang et al. |
| 2008/0305749 A1* | 12/2008 | Ben-Bassat .............. H04B 1/18 455/77 |
| 2009/0302968 A1* | 12/2009 | Van Bezooijen .... H04B 1/0458 333/32 |
| 2011/0037679 A1 | 2/2011 | Shlager et al. |
| 2012/0212382 A1* | 8/2012 | Zhang ................... H01Q 1/241 343/723 |
| 2013/0052967 A1* | 2/2013 | Black ...................... H04B 1/18 455/77 |
| 2013/0286937 A1* | 10/2013 | Liu ....................... H04W 48/16 370/328 |
| 2015/0116183 A1* | 4/2015 | Tay ........................ H01Q 1/243 343/860 |

OTHER PUBLICATIONS

Huitema, L., et al., "A compact and reconfigurable DVB-antenna for mobile handheld devices," Proceedings of the 5th European Conference on Antennas and Propagation, Apr. 11-15, 2011, pp. 1314-1317.

Noguchi, K., et al., "A compact broad-band helical antenna with two-wire helix," IEEE Transactions on Antennas and Propagation, vol. 51, No. 9, Sep. 2003, pp. 2176-2181.

Basaran, S., et al., "A frequency reconfigurable monopole antenna based on complementary split-ring resonators," IEEE Antennas and Propagation Society International Symposium, Jul. 8-14, 2012, pp. 1-2.

Mazlouman, S., et al., "A frequency tunable embedded normal-mode helix antenna for portable wireless devices," Proceedings of the 5th European Conference on Antennas and Propagation, Apr. 11-15, 2011, pp. 2230-2234.

White, C., et al., "A non-foster VHF monopole antenna," IEEE Antennas and Wireless Propagation Letters, vol. 11, Jun. 1, 2012, pp. 584-587.

Webster, R.E., "A single-control tuning circuit for electrically small antennas," I-R-E Transactions—Antennas and Propagation, Jan. 1955, pp. 12-15.

Zammit, J.A., et al., "A small tunable antenna using multiple shorting posts and varactor diodes," ISCCSP, Malta, Mar. 12-14, 2008, pp. 83-86.

Lim, S., et al., "A tunable electrically small antenna for ground wave transmission," IEEE Transactions on Antennas and Propagation, vol. 54, No. 2, Feb. 2006, pp. 417-421.

Mias, C., et al., "A varactor-tunable high impedance surface with a resistive-lumped-element biasing grid," IEEE Transactions on Antennas and Propagation, vol. 55, No. 7, Jul. 2007, pp. 1955-1962.

Gupta, A., et al., "An efficient electrically small antenna at HF band," Proceedings of the Asia-Pacific Microwave Conference, Dec. 5-8, 2011, pp. 856-859.

Yu, Y., et al., "An electrically small frequency reconfigurable antenna with a wide tuning range," IEEE Antennas and Wireless Propagation Letters, vol. 10, Feb. 14, 2011, pp. 103-106.

Ogawa, K., et al., "Automatic impedance matching of an active helical antenna near a human operator," 33rd European Microwave Conference, Munich, Oct. 7-9, 2003, pp. 1271-1274, vol. 3.

Jin, P., et al., "Broadband, efficient, electrically small metamaterial-inspired antenna's facilitated by active near-field resonant parasitic elements," IEEE Transactions on Antennas and Propagation, vol. 58, No. 2, Feb. 2010, pp. 318-327.

Zhu, S., et al., "Compact low frequency varactor loaded tunable SRR antenna," IEEE Transactions on Antennas and Propagation, Apr. 2013, pp. 2301-2304.

Abutarboush, H.R., et al., "Compact printed multiband antenna with independent setting suitable for fixed and reconfigurable wireless communication systems," IEEE Transactions on Antennas and Propagation, vol. 60, No. 8, Aug. 2012, pp. 3867-3874.

Obeidat, K.A., et al., "Design of frequency reconfigurable antennas using the theory of network characteristic modes," IEEE Transactions on Antennas and Propagation, vol. 58, No. 10, Oct. 2010, pp. 3106-3113.

Bakr, M.H., "Dynamic real time tuning of antenna matching circuit in the receiving mode," IEEE Antennas and Propagation Society International Symposium, Jul. 11-17, 2000, pp. 1-4.

Liu, L., et al., "Electrically small antenna tuning techniques," Loughborough Antennas and Propagation Conference, Nov. 16-17, 2009, pp. 313-316.

Cheng, X., et al., "Electrically small tunable split ring resonator antenna," IEEE Antennas and Propagation Society International Symposium, Jul. 11-17, 2010, pp. 1-4.

Hallbjorner, P., "Electrically small unbalanced four-arm wire antenna," IEEE Transactions on Antennas and Propagation, vol. 52, No. 6, Jun. 2004, pp. 1424-1428.

Lim, S., et al., "Frequency tuning of an electrically small antenna for HF ground wave transmission," IEEE Antennas and Propagation Society International Symposium, Jul. 3-8, 2005, pp. 33-36 vol. 1B.

Clavijo, S.A., "Low-profile mounting-tolerant folded-out annular slot antenna for VHF applications," IEEE Antennas and Propagation Society International Symposium, Jun. 9-15, 2007, pp. 13-16.

Chang, T., et al., "Meander antenna with backside tuning stubs," IEEE Transactions on Antennas and Propagation, vol. 53, No. 4, Apr. 2005, pp. 1274-1277.

"New tunable technology for mobile-TV antennas," Microwave Journal, Nov. 2008.

Christodoulou, C.G., et al., "Planar reconfigurable antennas," First European Conference on Antennas and Propagation, Nov. 6-10, 2006, pp. 1-7.

(56) References Cited

OTHER PUBLICATIONS

Sievenpiper, D., et al., "Reconfigurable antennas based on electrically tunable impedance surfaces," 31st European Microwave Conference, Sep. 24-26, 2001, pp. 1-4.

Aberle, J.T., et al., "Reconfigurable antennas for portable wireless devices," IEEE Antennas and Propagation Magazine, vol. 45, No. 6, Dec. 2003, pp. 148-154.

Lu, J., et al., "Single-feed circularly polarized equilateral-triangular microstrip antenna with a tuning stub," IEEE Transactions on Antennas and Propagation, vol. 48, No. 12, Dec. 2000, pp. 1869-1872.

Liu, L., et al., "Study on tunable electrically small antennas," 3rd European Conference on Antennas and Propagation, Mar. 23-27, 2009, pp. 805-808.

Feldner, L.M., et al., "Tunable electrically small UHF PIFA-as-a-package," IEEE Antennas and Propagation Society International Symposium, Jul. 9-14, 2006, pp. 185-188.

Aguilar, S.M., et al., "Tunable harmonic re-radiator for sensing applications," IEEE Microwave Symposium Digest, Jun. 7-12, 2009, pp. 1565-1568.

Adams, J.J., et al., "Tuning method for a new electrically small antenna with low Q," IEEE Antennas and Wireless Propagation Letters, vol. 8, Feb. 18, 2009, pp. 303-306.

Mishra, R.K., et al., "Tuning of microstrip antenna on ferrite substrate," IEEE Transactions on Antennas and Propagation, Feb. 1993, vol. 41, No. 2, pp. 230-233.

Kandoian, A.G., et al., "Wide-frequency-range tuned helical antennas and circuits," Electrical Communication, Dec. 1953, vol. 30, No. 4, pp. 294-299.

\* cited by examiner

ADAPTIVE SELF-TUNABLE ANTENNA SYSTEM AND METHOD

TECHNICAL FIELD

This application generally relates to adaptive self-tunable antenna systems and methods. In particular, this application relates to systems and methods for adaptively tuning an antenna with a closed-loop system including a sensing antenna, an RF detector, a processor, and an antenna tuner; and for a tunable antenna.

BACKGROUND

Audio production can involve the use of many components, including microphones, wireless audio transmitters, wireless audio receivers, recorders, and/or mixers for capturing and recording the sound of productions, such as television programs, newscasts, movies, live events, and other types of productions. The microphones typically capture the sound of the production, which is wirelessly transmitted from the microphones and/or the wireless audio transmitters to the wireless audio receivers. The wireless audio receivers can be connected to a recorder and/or a mixer for recording and/or mixing the sound by a crew member, such as a production sound mixer. Electronic devices, such as computers and smartphones, may be connected to the recorder and/or mixer to allow the crew member to monitor audio levels and timecodes.

Wireless audio transmitters, wireless audio receivers, and other portable wireless communication devices include antennas for transmitting radio frequency (RF) signals which contain digital or analog signals, such as modulated audio signals, data signals, and/or control signals. Users of portable wireless communication devices include stage performers, singers, actors, news reporters, and the like. One common type of portable wireless communication device is a wireless bodypack transmitter, which is typically secured on the body of a user with belt clips, straps, tape, etc.

The electrically small antennas included on portable wireless communication devices are typically low profile and small so that the size of the devices is reduced, physical interaction with the antennas is minimized, and to assist in concealing the devices from an audience. Antennas may extend from the device or be included within the device, depending on the type of antenna being utilized. However, the usable bandwidth and efficiency of an antenna are reduced as the size of the antenna is reduced, due to fundamental physical limitations. Furthermore, electrically small antennas are more likely to be subject to the detuning effects of being close to a human body. For example, an RF signal transmission may be degraded by 20 dB in some situations because of the proximity of a human body near an antenna.

Typical antenna types used in portable wireless communication devices include quarter wave whip antennas, partial or complete helical antennas, ceramic chip antennas, and other types of antennas. Each of these antenna types has drawbacks. A quarter wave whip antenna may extend from the device and therefore be excessively long, hard to conceal, and prone to damage. A partial or complete helical antenna may also extend from the device and have limited operating bandwidth, degraded radiation efficiency, and be prone to detuning when close to a human body. While able to be included within a device and physically smaller than the other antenna types, a ceramic chip antenna may have very low radiation efficiency, extremely limited operating bandwidth, and also be prone to detuning when close to a human body.

Accordingly, there is an opportunity for systems and methods that address these concerns. More particularly, there is an opportunity for adaptive self-tunable antenna systems and methods for tuning an antenna with a closed-loop system for enabling the antenna to have increased radiation resistance, improved radiation efficiency, maximized far field strength for improved auto-tunable operating frequency, less sensitivity to detuning, and the ability to be integrated within a device.

SUMMARY

The invention is intended to solve the above-noted problems by providing an adaptive self-tunable antenna system and method that are designed to, among other things: (1) utilize a sensing antenna for detecting a near field radio frequency (RF) signal from an RF signal transmitted from an antenna; (2) convert the near field RF signal to an RF strength control signal based on the strength of the near field RF signal; (3) generate an antenna tuning control signal based on the RF strength control signal; (4) control an electrical length of the antenna with an antenna tuner, based on the antenna tuning control signal, so that the strength of the RF signal transmitted from the antenna is maximized; and (5) provide an electrically small antenna in communication with a tuning network for improved radiation resistance and radiation efficiency. The antenna may be an electronically tunable antenna, and may be have any type of physical configuration.

In an embodiment, an adaptive self-tunable antenna system may include a sensing antenna for detecting a near field RF signal of an RF signal transmitted from a transmitting antenna. The system may also include a band pass filter for generating a filtered near field RF signal from the near field RF signal, and an RF detector for converting the filtered near field RF signal to an RF strength control signal that represents a strength of the filtered near field RF signal. A processor may receive the RF strength control signal and generate an antenna tuning control signal based on the RF strength control signal. An antenna tuner can be configured to control an electrical length of the transmitting antenna based on the antenna tuning control signal such that a strength of the RF signal transmitted by the transmitting antenna is maximized.

In another embodiment, a method for adaptively self tuning a transmitting antenna includes detecting a near field RF signal of an RF signal transmitted from the transmitting antenna. The near field RF signal may be band pass filtered to generate a filtered near field RF signal. The filtered near field RF signal may be converted to an RF strength control signal that represents a strength of the filtered near field RF signal, and an antenna tuning control signal may be generated based on the RF strength control signal. An electrical length of the transmitting antenna may be controlled based on the antenna tuning control signal, such that a strength of the RF signal transmitted by the transmitting antenna is maximized.

In a further embodiment, an adaptive self-tunable antenna system may include a sensing antenna for detecting a first near field RF signal of a first RF signal at a first frequency, and for detecting a second near field RF signal of a second RF signal at a second frequency different from the first frequency. The first RF signal may have been transmitted from a first transmitting antenna and the second RF signal may have been transmitted from a second transmitting antenna. A first RF switch can convey a selected near field RF signal from the first or second near field RF signals, based on whether the first or second RF signal is being transmitted. First and second band pass filters may generate first and second filtered near field RF signals from the first and second near field RF signals, respectively. A second RF switch can convey a selected filtered near field RF signal from the first or second filtered near field RF signals, based on whether the first or second RF signal is being transmitted. An RF detector may convert the selected filtered near field RF signal to an RF strength control signal representing a strength of the selected filtered near field RF signal. A processor may receive the RF strength control signal and generate an antenna tuning control signal based on the RF strength control signal. A first antenna tuner can be configured to control an electrical length of the first transmitting antenna based on the antenna tuning control signal such that a strength of the first RF signal transmitted by the first transmitting antenna is maximized. A second antenna tuner can be configured to control an electrical length of the second transmitting antenna based on the tuning control signal such that a strength of the second RF signal transmitted by the second transmitting antenna is maximized. In some embodiments, the second transmitting antenna may include multiple transmitting antennas, such as in a diversity configuration, for example. In these embodiments, the second antenna tuner can be configured to select the most efficient transmitting antenna at a given time instance for transmission of the RF signal.

In another embodiment, an antenna structure for transmitting an RF signal includes a first helical branch and a second helical branch disposed on a substrate. The first helical branch and the second helical branch are disposed parallel to one another, and are not electrically connected to one another. The antenna may also include a tuning network in communication with the first and second helical branches, and be configured to control a first electrical length of the first helical branch and a second electrical length of the second helical branch such that a radiation resistance of the antenna is maximized. Each of the first and second helical branches of the antenna transmits the RF signal.

These and other embodiments, and various permutations and aspects, will become apparent and be more fully understood from the following detailed description and accompanying drawings, which set forth illustrative embodiments that are indicative of the various ways in which the principles of the invention may be employed.

DETAILED DESCRIPTION

Figure 1A:
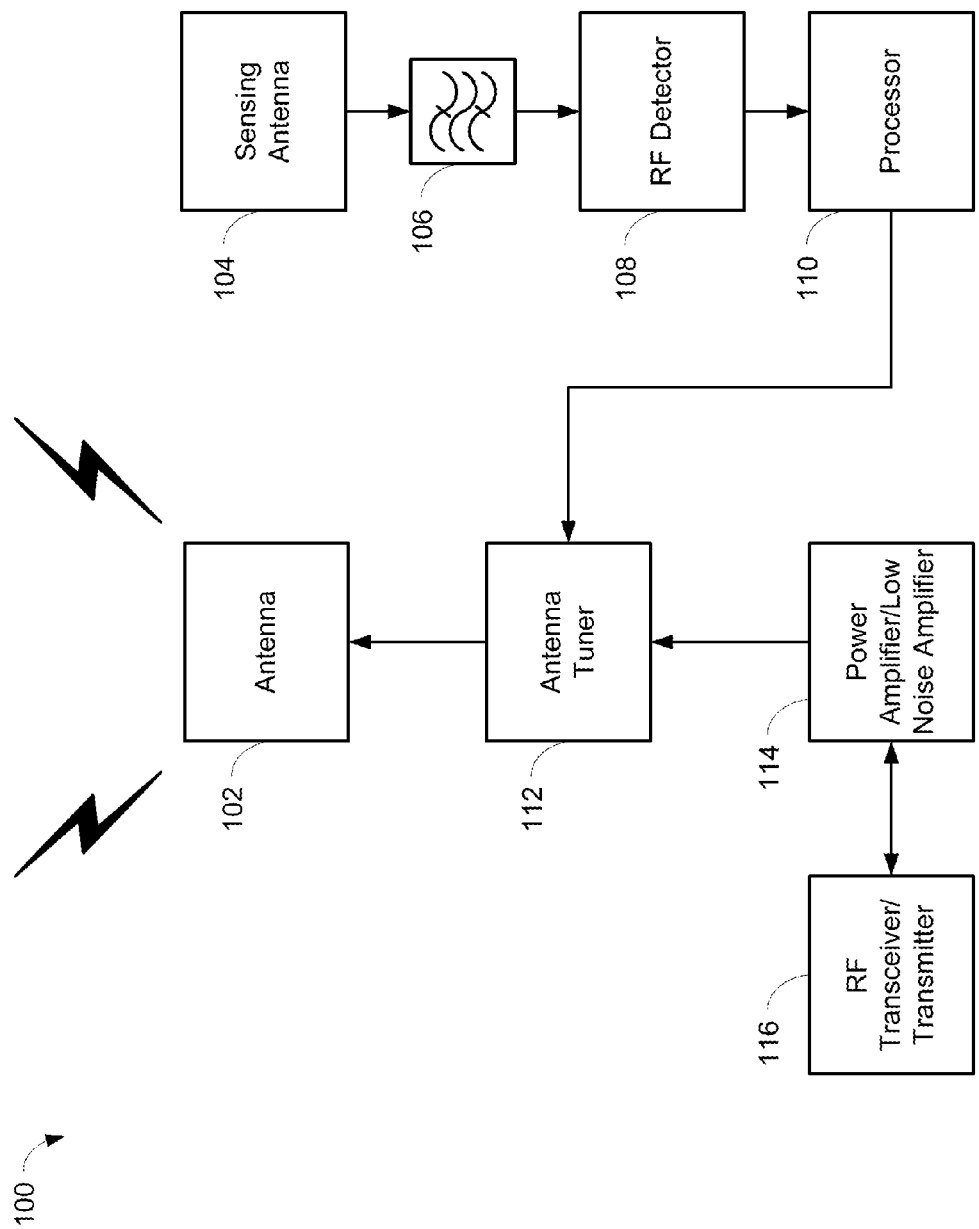
FIGS. 1A-1B are block diagrams of a single-band adaptive self-tunable antenna system, in accordance with some embodiments.

The description that follows describes, illustrates and exemplifies one or more particular embodiments of the invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

The adaptive self-tunable antenna systems and methods described below can enable an antenna to have improved performance over other types of antennas, and in particular, over electrically small conformal antennas. The closed-loop tuning of the systems and methods allow bandwidth-limited electrically small antennas to effectively have an operative bandwidth approaching the bandwidth of quarter wave antennas, but be physically smaller and enclosed within a device, due to the conformal aspect of the antenna. Furthermore, the antenna has an increased radiation resistance and improved radiation efficiency, and the adaptive closed-loop antenna tuning system can dynamically compensate and minimize antenna detuning due to interaction with the human body or other interfering objects. In particular, the antenna detuning effects due to a human body, e.g., a person holding the device, may include altering conductor currents of the antenna, and can be compensated for with the adaptive self-tunable antenna systems and methods.

FIG. 1A illustrates a block diagram of one embodiment of a single-band adaptive self-tunable antenna system 100 for optimally transmitting a radio frequency (RF) signal. The system 100 may be a closed loop system that enables the antenna 102 to transmit the RF signal at a maximized strength and higher radiation efficiency through the use of a near field sensing antenna 104, a band pass filter 106, an RF detector 108, a processor 110, and an antenna tuner 112. By using the system 100, the bandwidth-limited tunable antenna 102 may transmit an RF signal at a particular frequency, such as in the UHF/VHF band or other frequency band, at maximum radiated power. The antenna 102 may include dual parallel helical branches, as described below, for example, or may be of another configuration. The RF signal transmitted by the antenna 102 may contain audio signals or data signals modulated by analog and/or digital modulation schemes, for example. The signals may have been modulated by an analog or digital RF transceiver/transmitter 116 and amplified by a properly matched power amplifier 114 (when RF transceiver/transmitter 116 is in a transmitter configuration), or by a power amplifier/low noise amplifier 114 (when RF transceiver/transmitter 116 is in a transceiver configuration). The RF transceiver/transmitter 116 may be in communication with other components (not shown), such as a microphone or playback device, with digital data signals, control signals, etc. The system 100 may be included within a wireless audio transmitter, for example, and the RF signal may be transmitted from the antenna 102 to be received by a wireless audio receiver, recorder, and/or other component for further processing.

The system 100 may also dynamically improve matching of the antenna 102 to the output of the power amplifier 114. Such matching is typically degraded in the portable wireless system context due to variations in antenna impedance caused by interaction with a human body or other objects. As such, the self-tuning and matching enabled by the system 100 can reduce design constraints for the power amplifier 114, improve stability and power efficiency, and reduce power consumption. The overall complexity and cost of components of the system 100, such as the power amplifier 114 and/or RF transceiver/transmitter 116, may also be reduced compared to current systems.

The sensing antenna 104 may detect a near field RF signal of the RF signal transmitted from the antenna 102. A radiative near field RF signal is the RF signal that is physically closest to the antenna 102 and is generally within a fraction of wavelength of the RF signal from the antenna. Detecting the near field RF signal with the sensing antenna 104 enables the system 100 to determine the tuning of the antenna 102 because there is a strong correlation between the strength of a near field RF signal and the strength of its associated far field RF signal. The far field RF signal is the RF signal that is the "real radiated power" signal that is received by a receiver situated farther away from the antenna. Accordingly, after sensing the near field RF signal, the system 100 can control the antenna tuner 112 to maximize the strength of the RF signal transmitted by the antenna 102. The sensing antenna 104 may be a trace on a printed circuit board, a wire, or a broadband antenna, for example, and may provide a high input impedance to the RF detector 108 so that near field loading effects are minimized.

The near field RF signal may be provided from the sensing antenna 104 to the band pass filter 106. The band pass filter 106 rejects RF signals detected by the sensing antenna 104 that are out of the frequency band being transmitted by the antenna 102 in order to avoid antenna tuning distortion. For example, if the sensing antenna 104 detects RF signals at nearby frequencies from devices that are physically close to the system 100, the band pass filter 106 can filter out the other RF signals so that the RF signal transmitted by the antenna 102 is further processed. The band pass filter 106 may be a discrete band pass filter, a microwave band pass filter, a SAW band pass filter, a helical band pass filter, a dielectric band pass filter, or other type of filter. The particular type of band pass filter 106 may depend on out-of-band rejection requirements. The RF detector 108 may convert the filtered near field RF signal from the band pass filter 106 to an RF strength control signal representing the strength of the filtered near field RF signal. The RF strength control signal may be a DC voltage or a digital signal (e.g., SPI, $I^2C$, etc.), for example. The RF detector 108 may be calibrated so that it is sensitive only to the minimum required dynamic tuning range of the antenna 102, e.g., limited only to 5-15 dB. In this way, interference caused by high power signals within the frequency band can be minimized. The RF detector 108 may be an AD8361 integrated circuit from Analog Devices, Inc., for example.

The processor 110 may receive the RF strength control signal from the RF detector 108 and generate an antenna tuning control signal based on the RF strength control signal. The processor 110 may be encompassed in the system 100 and perform other functionality, or may be a separate component. Routines executing on the processor 110 may result in the tuning of the antenna 102 through generation of the antenna tuning control signal to the antenna tuner 112. In particular, the antenna tuner 102 may control the electrical length of the antenna 102 based on the antenna tuning control signal so that the strength of the transmitted RF signal is maximized. The processor 110 may periodically sample the strengths of the near field RF signal at the current frequency, at the frequency one tuning state higher than the current frequency, and at the frequency one tuning state lower than the current frequency. The tuning control signal may then be generated so that the antenna 102 is tuned to the tuning state that has the highest measured strength of the near field RF signal. An embodiment of a method for generating the tuning control signal is described below with reference to FIG. 5.

Figure 6:
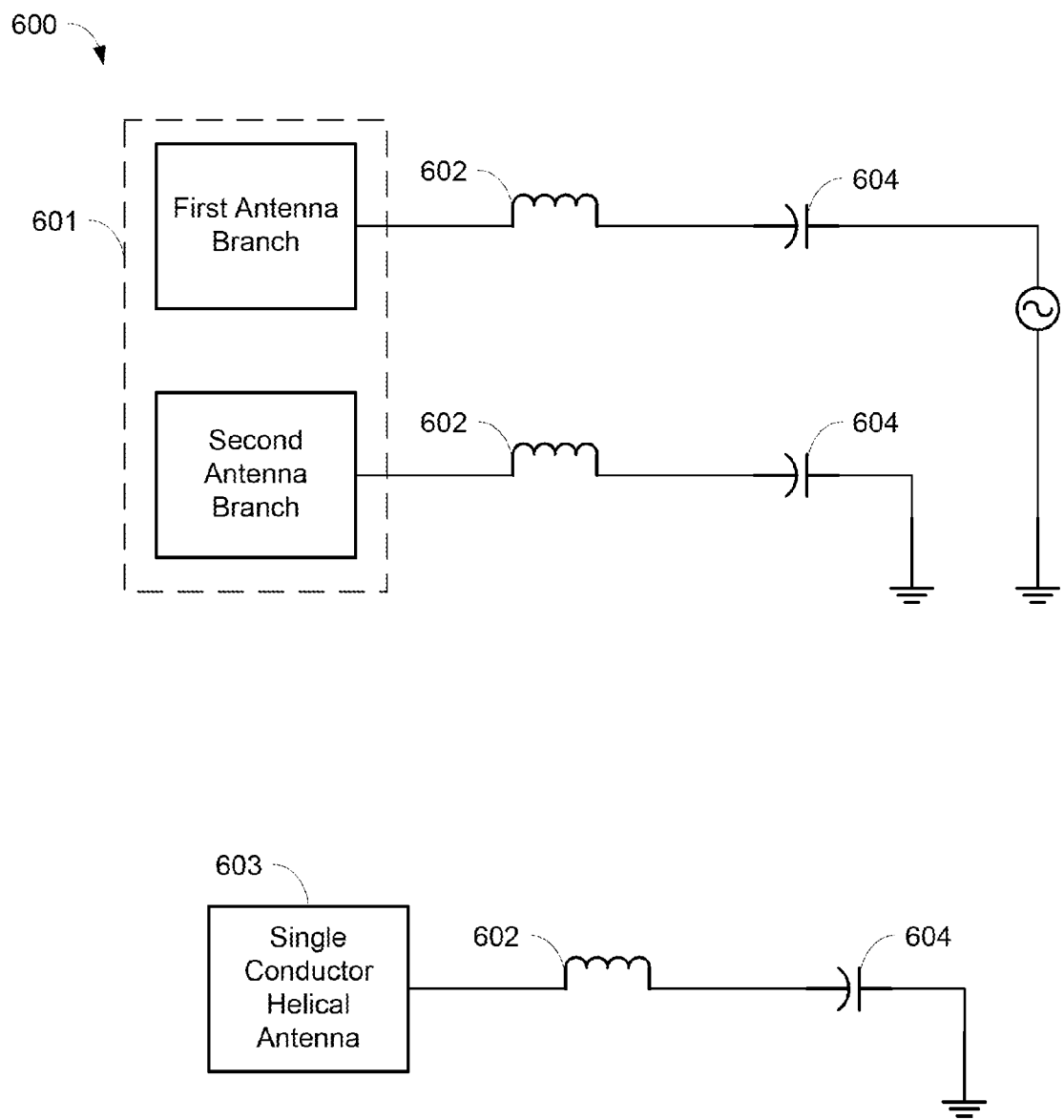
FIG. 6 is an exemplary schematic of an antenna tuner, in accordance with some embodiments.

The antenna tuner 112 may be a balanced phase shifter that can control the electrical length of the antenna 102 based on the antenna tuning control signal so that the strength of the transmitted RF signal is maximized. In particular, the net reactance of the antenna tuner 112 can be controlled using the antenna tuning control signal to tune the antenna 102 to have an antenna resonance at a particular frequency being transmitted. In one embodiment, shown in FIG. 6, the two branches of the antenna 601 are respectively connected to a tuning network 600 that includes an inductor 602 and a capacitor 604 connected in series. The inductors 602 in the tuning network 600 may have a high quality factor Q (and a corresponding low series resistance value including the capacitors 604) so that signal losses are minimized in the tuning network 600. For antenna resonance at a low band edge frequency, the capacitors 604 may be adjusted to a high value, e.g., 10-1000 pF, depending on the operating frequency in a particular band (e.g., VHF, UHF, L band, S band, C band, etc.), in conjunction with a properly selected inductance of the inductors 602. The value of the capacitors 604 can be decreased in order to move the antenna resonance to the required operating frequency. The minimum value of the capacitors 604 occur at a high band edge frequency of antenna resonance. FIG. 6 also includes an embodiment with a single conductor helical antenna 603, an inductor 602, and a capacitor 604 connected in series. Use of the adaptive self-tuning system 100 can continuously compensate for dynamically changing loading effects on the antenna due to user handling and proximity to a human body and other objects. The capacitors 604 may be digitally tunable capacitors (DTC), microelectromechanical (MEMS) capacitors, or varactor diodes, for example. In particular, the tuning control signal may control the capacitance values of the capacitors or varactor diodes so that the electrical length of the antenna 601 is appropriately controlled.

Figure 7:
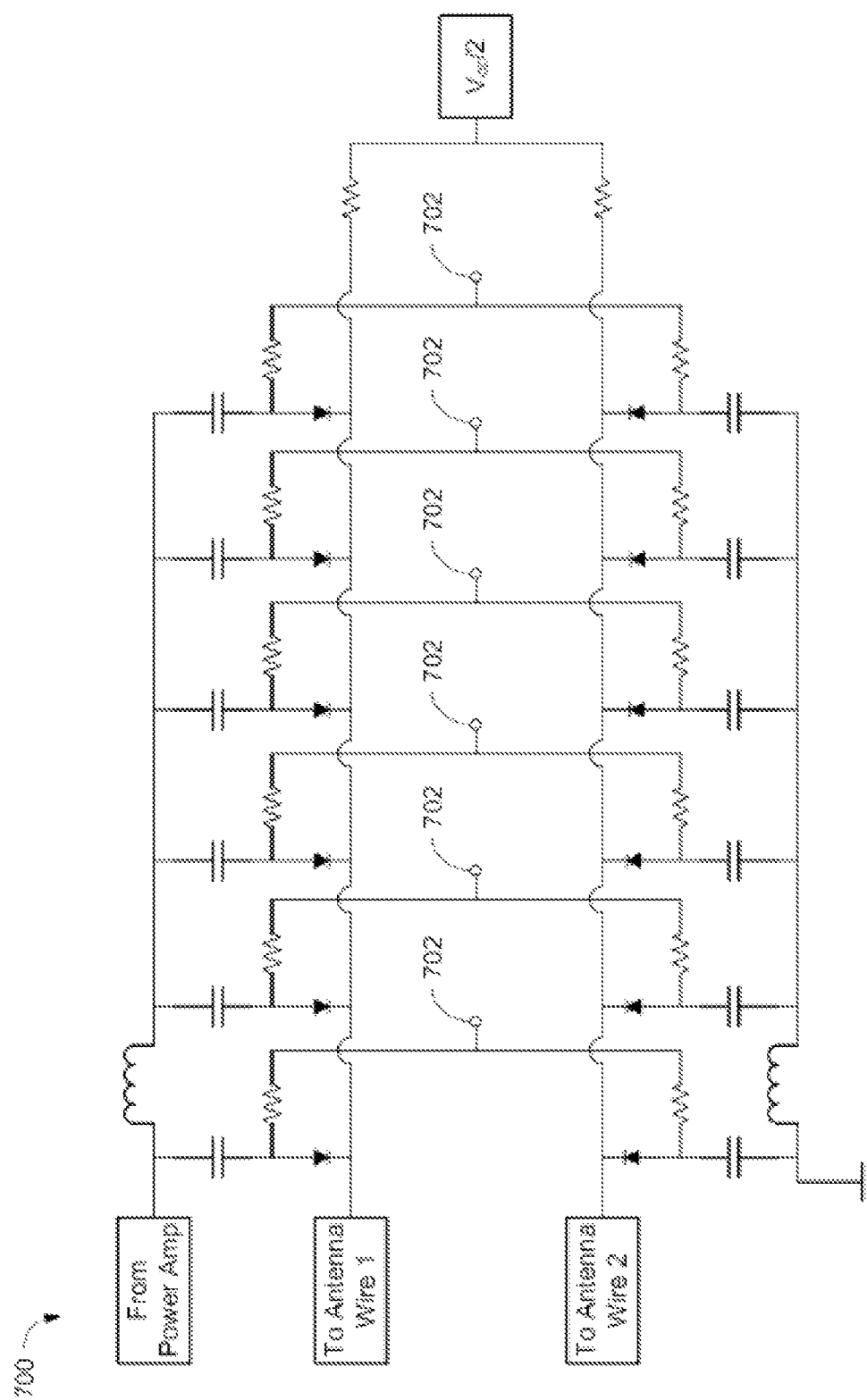
FIG. 7 is an exemplary alternative schematic of an antenna tuner, in accordance with some embodiments.

In another embodiment, shown in FIG. 7, the two branches of the antenna 102 are connected to a balanced tuning network 700 composed of PIN diodes. The PIN diodes can be used to short circuit or open circuit particular segments in the tuning network 700, based on a tuning control signal presented to the network 700 on input ports 702. In particular, the appropriate PIN diodes may be biased so that the electrical length of the antenna 102 is controlled to cause the antenna 102 to resonate at the desired frequency, based on the antenna tuning control signal. The operation of the balanced tuning network 700 has some similarities to the tuning network 600 shown in FIG. 6. In some embodiments, the tuning control signals for the PIN diodes on input ports 702 may be connected to General Purpose Input/Output ports of a microcontroller or processor. In this configuration, the microcontroller or processor can turn on and off the appropriate PIN diodes, based on an algorithm for generating the antenna tuning control signal. An antenna configuration including dual helical branches may receive optimal benefits from the balanced tuning network 700, while an antenna configuration including a single conductor may receive optimal benefits from the tuning network 600.

Figure 1B:
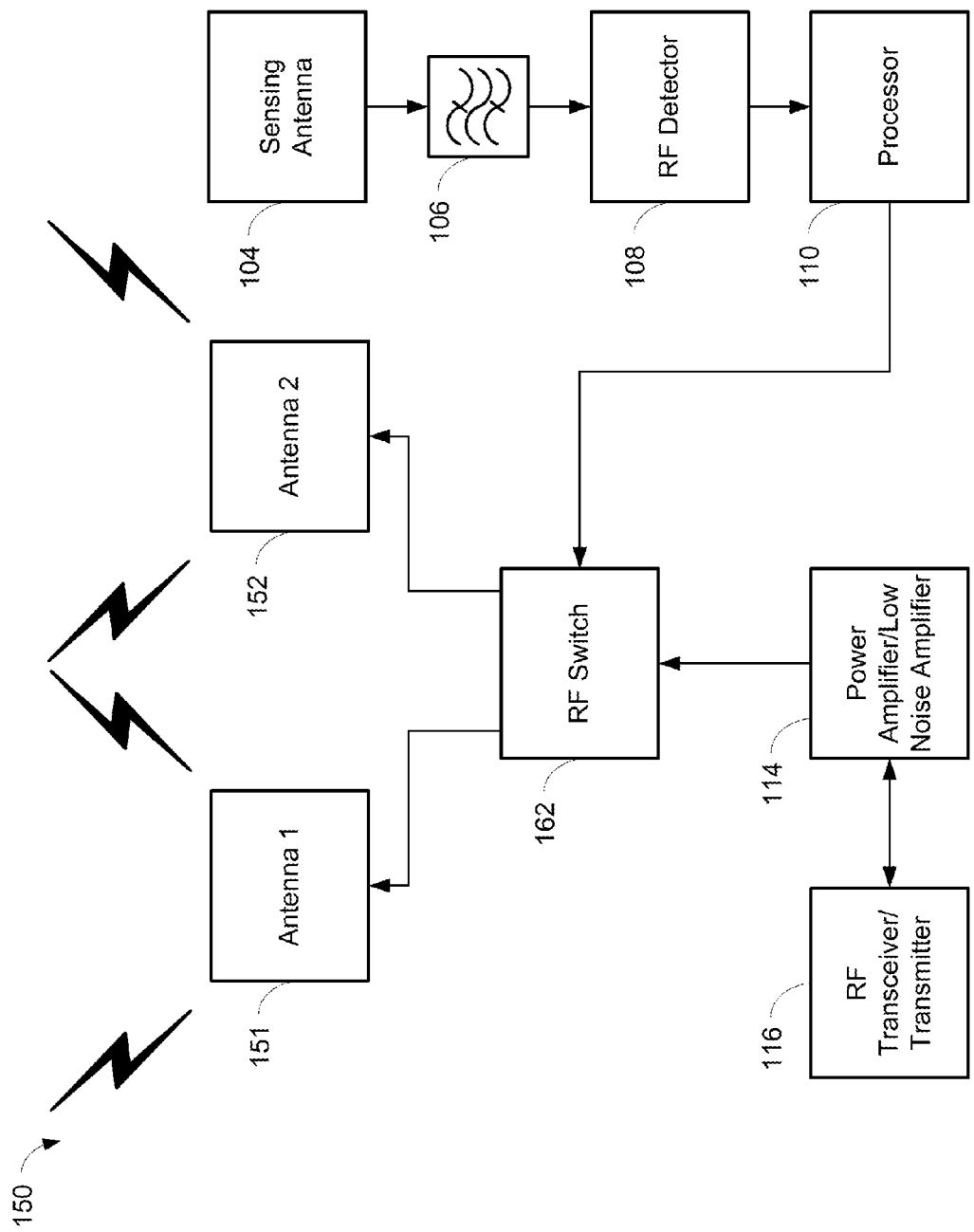

FIG. 1B illustrates a block diagram of another embodiment of a single-band adaptive self-tunable antenna system 150 for optimally transmitting a radio frequency (RF) signal. The system 150 may be a closed loop system that enables the antennas 151, 152 to transmit the RF signal at a maximized strength and higher radiation efficiency through the use of a near field sensing antenna 104, a band pass filter 106, an RF detector 108, a processor 110, and a RF switch 162. The antennas 151, 152 may be fixed diversity antennas, and the RF switch 162 may select the best antenna of the antennas 151, 152 to transmit the RF signal. The RF signal transmitted by the antennas 151, 152 may contain audio signals or data signals modulated by analog and/or digital modulation schemes, for example. The near field sensing antenna 104, the band pass filter 106, the RF detector 108, and the processor 110 in the system 150 may each have the same functionality as described above with respect to the system 100 of FIG. 1A. The processor 110 may also control the RF switch 162 based on the antenna tuning control signal so, taking into account the antenna detuning effects of the human body, the particular antenna 151, 152 that is radiating the highest power is selected for transmission.

Figure 2A:
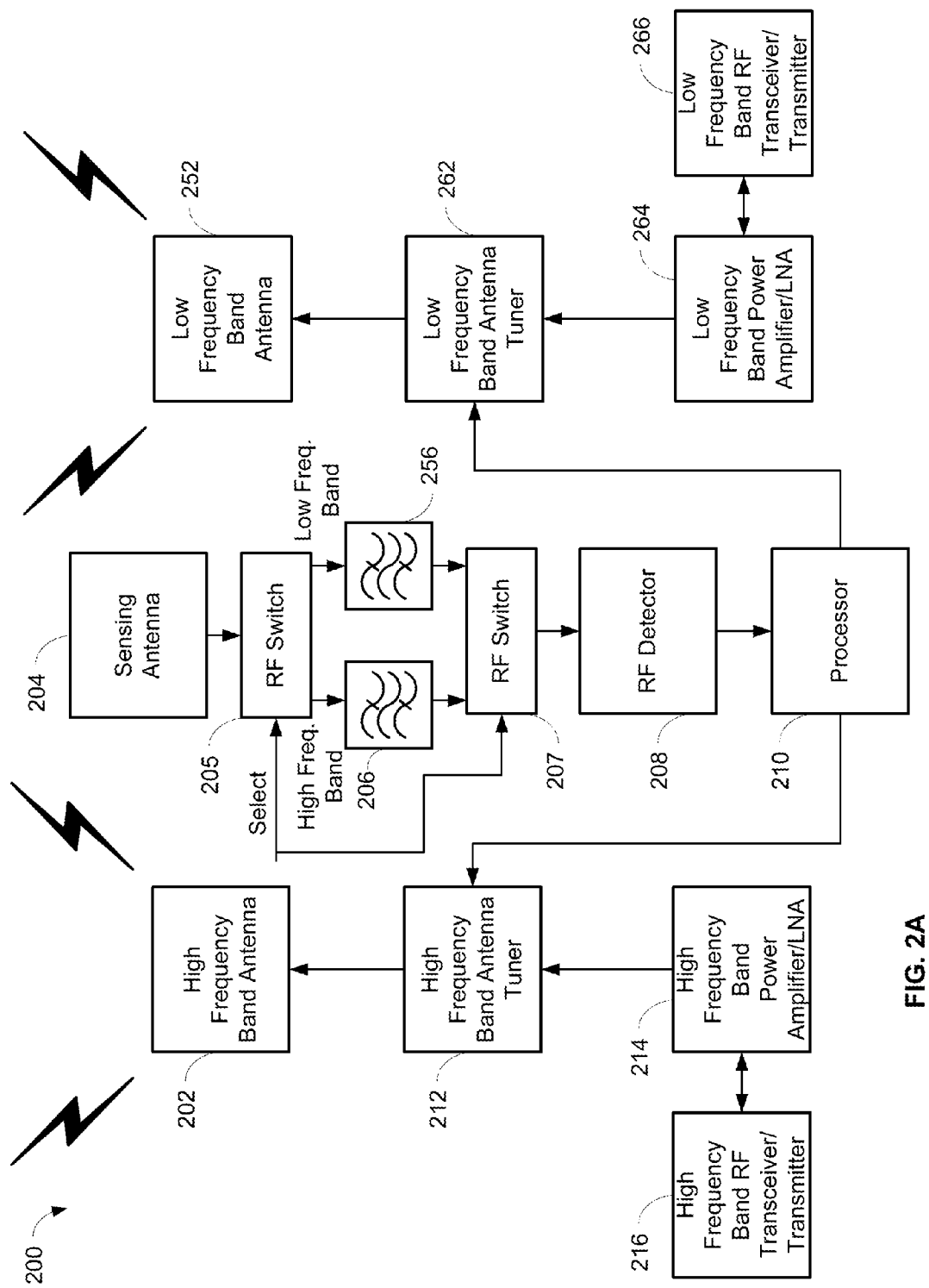
FIGS. 2A-2B are block diagrams of a dual-band adaptive self-tunable antenna system, in accordance with some embodiments.

FIG. 2A illustrates a block diagram of a dual-band adaptive self-tunable antenna system 200 for optimally transmitting RF signals. The system 200 may be a closed loop system that enables the antennas 202 and 252 to transmit RF signals at a maximized strength and higher radiation efficiency through the use of a sensing antenna 204, RF switches 205 and 207, band pass filters 206 and 256, an RF detector 208, a processor 210, and antenna tuners 212 and 262. By using the system 200, the antenna 202 may transmit an RF signal at a particular frequency, such as in a high frequency band (e.g., 2.4 GHz or 5.7 GHz), and the antenna 252 may transmit an RF signal at another frequency, such as in a low frequency band (e.g., UHF/VHF), at maximum radiated power. In some embodiments, the antenna 202 may be tuned to transmit its RF signal during a preamble period of a digital transmission packet, and the antenna 252 may be continuously tuned to transmit its RF signal (e.g., an analog modulation RF signal) except during the preamble period of the digital transmission packet being transmitted.

The antenna 202 may transmit RF signals in the high frequency band that contain monitoring and control signals, for example, that can enable the management of components within a larger system. The monitoring and control signals may include adjustment of the gain of wireless audio transmitters, monitoring of audio levels, and/or monitoring and control of wireless aspects of the larger system, such as RF performance, statistics, etc. A wireless link (e.g., through an IEEE 802.15.4/ZigBee-based protocol, such as ShowLink Remote Control, available from Shure Inc.) may be utilized for the monitoring and control signals. The monitoring and control signals may have been generated by an RF transceiver/transmitter 216 and amplified by a properly matched power amplifier 214 (when RF transceiver/transmitter 216 is in a transmitter configuration), or by a power amplifier/low noise amplifier 214 (when RF transceiver/transmitter 216 is in a transceiver configuration). The RF transceiver/transmitter 216 may be in communication with other components (not shown). In some embodiments, the antenna 202 includes two chip antennas in a space diversity configuration when transmitting at 2.4 GHz. When transmitting at 2.4 GHz, the sensing antenna 204 can monitor the strengths of the near field RF signals from both chip antennas during the preamble period of a digital transmission packet and then switch to the chip antenna that is radiating more RF power for the remaining duration of the digital transmission packet (e.g., the payload period).

The antenna 252 may include dual parallel helical branches, as described below, for example, or may be of another configuration. The RF signal transmitted by the antenna 252 may contain audio signals or data signals modulated by analog and/or digital modulation schemes, for example. The signals may have been modulated by an analog or digital RF transceiver/transmitter 266 and amplified by a properly matched power amplifier 264 (when RF transceiver/transmitter 266 is in a transmitter configuration), or by a power amplifier/low noise amplifier 264 (when RF transceiver/transmitter 266 is in a transceiver configuration). The RF transceiver/transmitter 266 may be in communication with other components (not shown), such as a microphone or playback device, with digital data signal, control signals, etc. The system 200 may be included within a wireless audio transmitter, for example, and the RF signals may be transmitted by the antennas 202 and 252 to be received by a wireless audio receiver, recorder, and/or other component for further processing.

The sensing antenna 204 may detect near field RF signals of the RF signals transmitted from the antennas 202 and 252. Detecting the near field RF signals with the sensing antenna 204 enables the system 200 to determine the tuning of the antennas 202 and 252 because there is a strong correlation between the strength of a near field RF signal and the strength of its associated far field RF signal. After sensing the near field RF signals, the system 200 can control the antenna tuners 212 and 262 to maximize the strengths of the RF signals transmitted by the antennas 202 and 252. The sensing antenna 204 may be a trace on a printed circuit board, a wire, or a broadband antenna, for example, and may provide a high input impedance to the RF detector 208 so that near field loading effects are minimized.

The detected near field RF signals may be provided from the sensing antenna 204 to an RF switch 205. The RF switch 205 may route the detected near field RF signals to one of the band pass filters 206 and 256, depending on a select signal that signifies whether the high frequency band RF signal or the low frequency band RF signal is being transmitted. For example, if the preamble portion of a transmission packet in the high frequency band RF signal is being transmitted, the RF switch 205 can route the near field RF signals to the high frequency band band pass filter 206. If the preamble portion of the transmission packet in the high frequency band RF signal is not being transmitted, the RF switch 205 can route the near field RF signals to the low frequency band band pass filter 256. The select signal can be triggered at the start of the preamble portion of the transmission packet, for example.

The band pass filters 206 and 256 can each reject RF signals detected by the sensing antenna 204 that are out of the frequency band being transmitted by the antennas 202 and 252, in order to avoid antenna tuning distortion. For example, if the sensing antenna 204 detects RF signals at nearby frequencies from devices that are physically close to the system 200, the band pass filters 206 and 256 can filter out the other RF signals so that the RF signals transmitted by the antennas 202 or 252 are further processed. In particular, since both the antennas 202 and 252 can simultaneously transmit respective RF signals, the band pass filters 206 and 256 will respectively reject the RF signal that was transmitted on the other frequency band, or other interfering signals that may be present. The band pass filters 206 and 256 may be a discrete band pass filter, a microwave band pass filter, a SAW band pass filter, a helical band pass filter, a dielectric band pass filter, or other type of filter. The particular type of band pass filter 106 may depend on out-of-band rejection requirements.

The RF switches 205 and 207 can route the filtered near field RF signals from the band pass filters 206 and 256 to the RF detector 208, depending on the select signal. If the preamble portion of a transmission packet in the high frequency band RF signal is being transmitted, the RF switch 207 can route the filtered near field RF signals from the high frequency band band pass filter 206 to the RF detector 208. If the preamble portion of the transmission packet in the high frequency band RF signal is not being transmitted, the RF switch 207 can route the filtered near field RF signals from the low frequency band band pass filter 256 to the RF detector 208.

The RF detector 208 may convert the selected filtered near field RF signal from the band pass filters 206 or 256 to an RF strength control signal representing the strength of the selected filtered near field RF signal. The RF strength control signal may be a DC voltage or a digital signal (e.g., SPI, I²C, etc.), for example. The RF detector 208 may be calibrated so that it is sensitive to the minimum dynamic tuning range required of the antennas 202 and 252, e.g., 15-25 dB. In this way, interference caused by high power signals within the frequency band can be minimized. The RF detector 208 may be an AD8361 integrated circuit from Analog Devices, Inc., for example.

The processor 210 may receive the RF strength control signal from the RF detector 208 and generate an antenna tuning control signal based on the RF strength control signal. The processor 210 may be encompassed in the system 200 and perform other functionality, or may be a separate component. Routines executing on the processor 210 may result in the tuning of the antennas 202 and 252 through generation of the antenna tuning control signal to the antenna tuners 212 or 262, depending on which antenna 202 or 252 is being tuned. In particular, the antenna tuners 212 and 262 may control the electrical length of the antennas 202 and 252, respectively, based on the antenna tuning control signal so that the strengths of the transmitted RF signals are maximized. The processor 210 may periodically sample the strengths of the near field RF signals at the current frequency, at the frequency one tuning state higher than the current frequency, and at the frequency one tuning state lower than the current frequency. The antenna tuning control signal may then be generated so that the antenna 202 or 252 being tuned is tuned to the tuning state that has the highest measured strength of the near field RF signal. An embodiment of a method for generating the tuning control signal is described below with reference to FIG. 5.

The antenna tuner 262 may be a balanced phase shifter that can control the electrical length of the antenna 252 based on the antenna tuning control signal so that the strength of the transmitted RF signal is maximized. In particular, the net reactance of the antenna tuner 262 can be controlled using the antenna tuning control signal to tune the antenna 252 to have an antenna resonance at the particular frequency being transmitted. As described above with reference to FIG. 1A, there may be various embodiments of the antenna tuner 262, as described and shown in FIGS. 6 and 7.

Figure 2B:
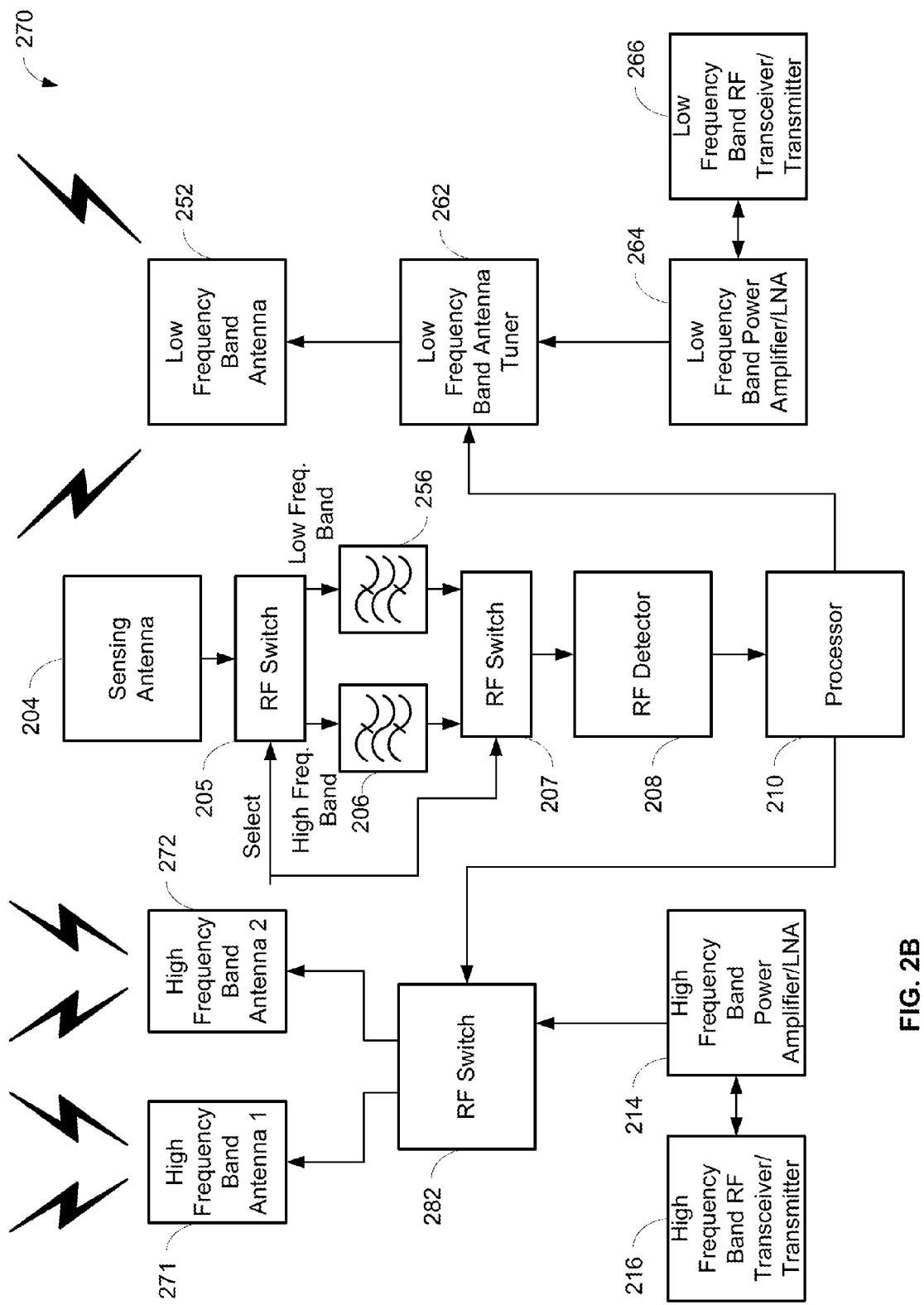

FIG. 2B illustrates a block diagram of a dual-band adaptive self-tunable antenna system 270 for optimally transmitting RF signals. The system 270 may be a closed loop system that enables the antennas 252 and 271, 272 to transmit RF signals at a maximized strength and higher radiation efficiency through the use of a sensing antenna 204, RF switches 205 and 207, band pass filters 206 and 256, an RF detector 208, a processor 210, antenna tuner 262, and an RF switch 282. The antennas 271, 272 may transmit an RF signal at a particular frequency, such as in a high frequency band (e.g., 2.4 GHz or 5.7 GHz). The antennas 271, 272 may be fixed diversity antennas, and the RF switch 282 may select the best antenna of the antennas 271, 272 to transmit the high frequency RF signal. The RF signals transmitted by the antennas 271, 272 may contain monitoring and control signals, for example, that can enable the management of components within a larger system. The sensing antenna 204, RF switches 205 and 207, band pass filters 206 and 256, RF detector 208, processor 210, and antenna tuner 262 may each have the same functionality as described above with respect to the system 200 of FIG. 2A. The processor 210 may also control the RF switch 282 based on the antenna tuning control signal so that the particular antenna 271, 272 that is radiating the highest power is selected for transmission of the high frequency RF signal.

Figure 3:
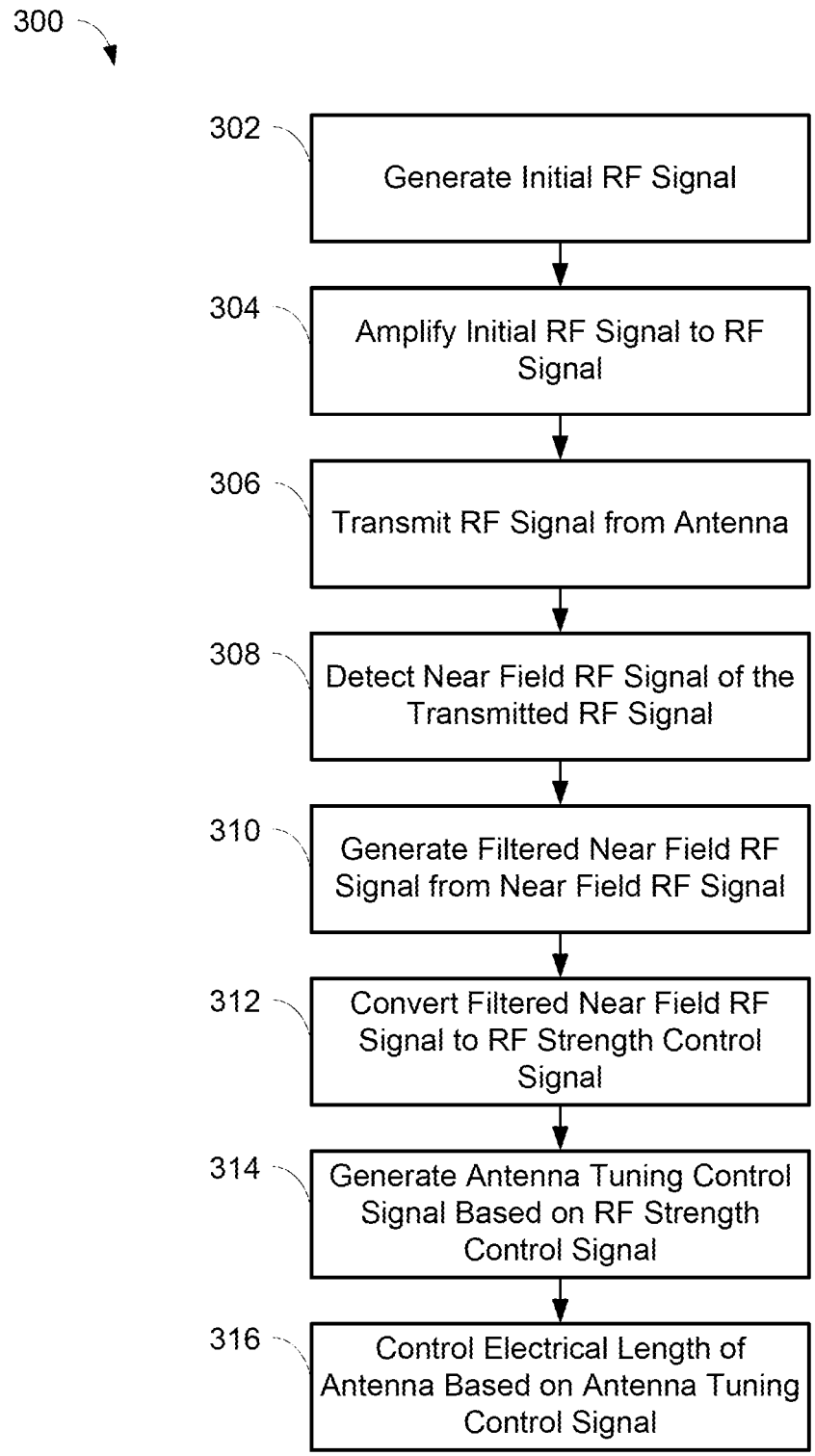
FIG. 3 is a flowchart illustrating operations for controlling an electrical length of a transmitting antenna based on an RF strength control signal and an antenna tuning control signal using the system of FIGS. 1A-1B, in accordance with some embodiments.

An embodiment of a process 300 for controlling an electrical length of an antenna based on an antenna tuning control signal is shown in FIG. 3. The process 300 can result in the generation of an antenna tuning control signal that controls the electrical length of an antenna so that an RF signal is transmitted at a maximized strength and higher radiation efficiency. At step 302, an initial RF signal may be generated, such as by an RF transceiver or transmitter. The initial RF signal may contain audio or data signals modulated by analog and/or digital modulation schemes, for example. The initial RF signal may be amplified at step 304 to an RF signal, such as with a power amplifier. The RF signal may be transmitted from an antenna at step 306 so that the RF signal can be received by a receiver component.

At step 308, a near field RF signal of the transmitted RF signal may be detected, such as by a sensing antenna. A near field RF signal is the RF signal that is physically closest to the antenna and is generally within a fraction of wavelength of the RF signal from the antenna. Detecting the near field RF signal helps to determine the tuning of the antenna because there is a strong correlation between the strength of a near field RF signal and the strength of its associated far field RF signal. The far field RF signal is the RF signal that is the "real radiated power" signal that is received by a receiver situated farther away from the antenna.

A filtered near field RF signal may be generated at step 310 from the near field RF signal detected at step 308. The filtered near field RF signal may be generated by a band pass filter, for example, so that RF signals out of the frequency band being transmitted can be rejected. At step 312, the filtered near field RF signal may be converted to an RF strength control signal, such as by an RF detector. The RF strength control signal may represent the strength of the filtered near field RF signal and may be a DC voltage or a digital signal (e.g., SPI, I$^2$C, etc.), for example. At step 314, an antenna tuning control signal may be generated based on the RF strength control signal. The antenna tuning control signal may be generated by routines executing on a processor, for example. The antenna tuning control signal may control an antenna tuner at step 316 to control the electrical length of the transmitting antenna to maximize the strength of the transmitted RF signal. In some embodiments, at step 316, the antenna tuning control signal may control an antenna tuner to select a best antenna for maximum radiated power, such as when the antenna being tuned has a multiple chip configuration. Further description of generating the antenna tuning control signal is discussed below with respect to FIG. 5.

Figure 4A:
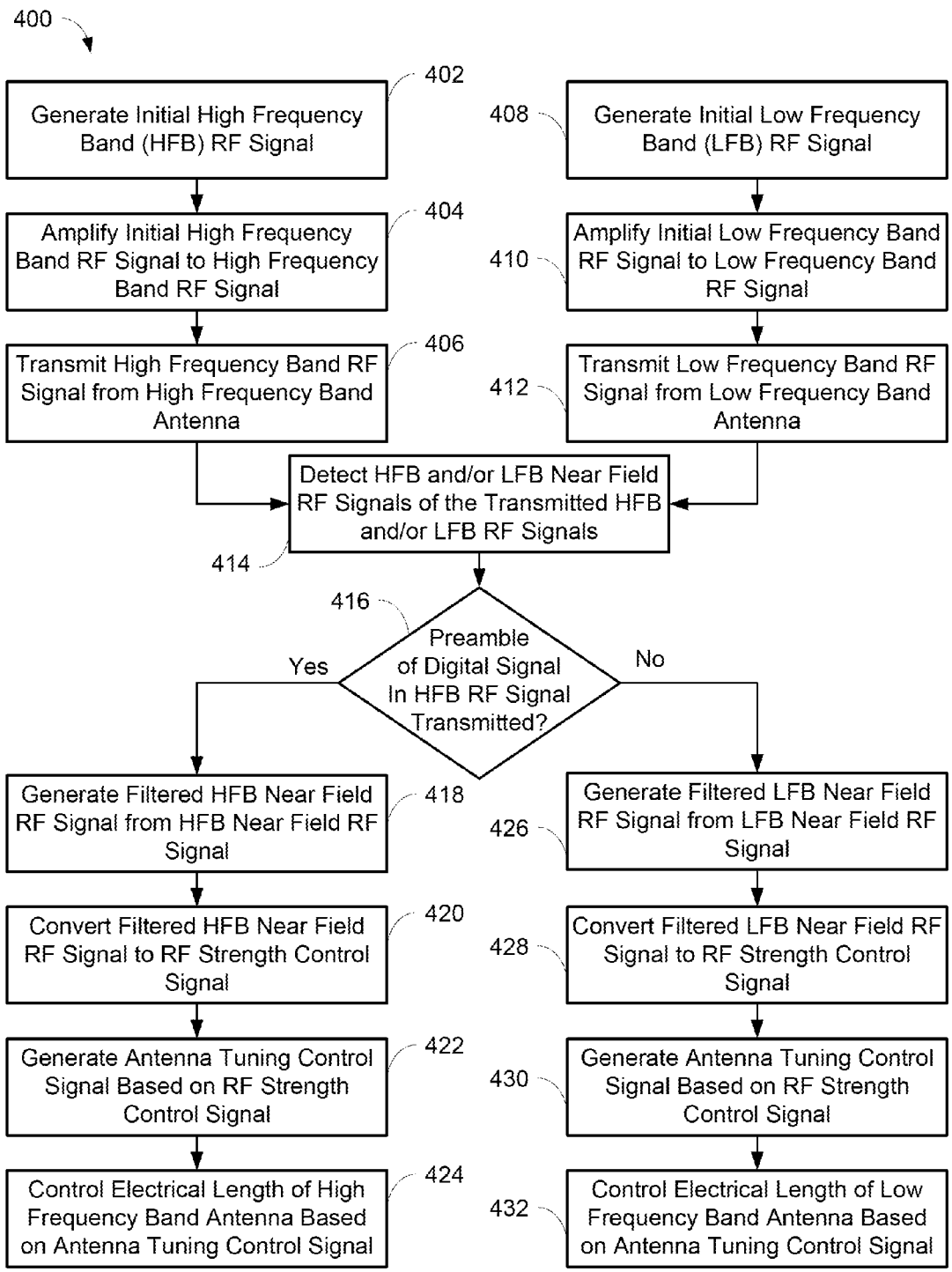
FIGS. 4A-4B are flowcharts illustrating operations for controlling electrical lengths of transmitting antennas based on an RF strength control signal and an antenna tuning control signal using the systems of FIGS. 2A-2B, respectively, in accordance with some embodiments.
Figure 4B:
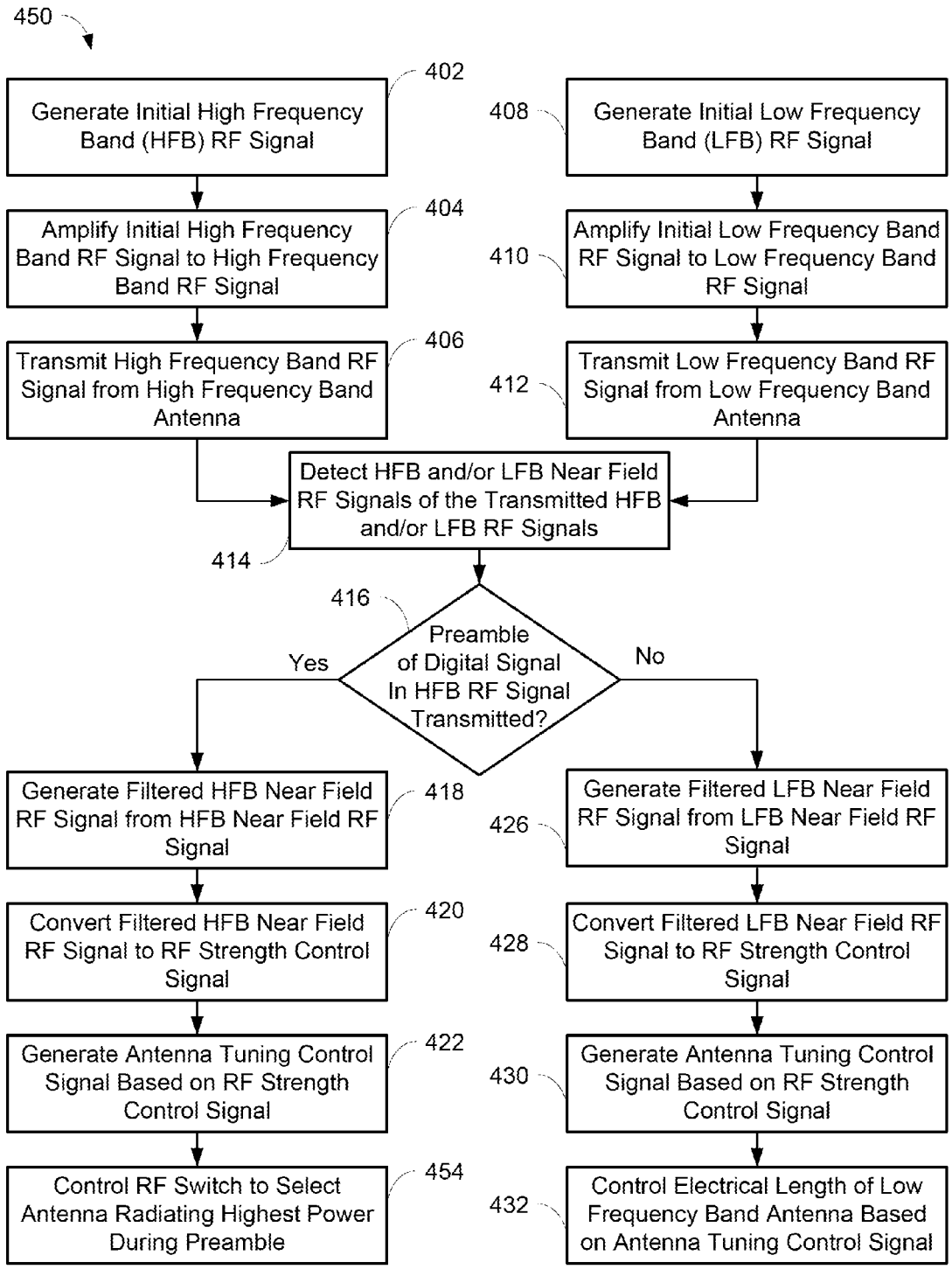

Embodiments of processes 400 and 450 for controlling the electrical lengths of antennas based on an antenna tuning control signal is shown in FIGS. 4A-4B, respectively. The processes 400 and 450 can result in the generation of an antenna tuning control signal that controls the electrical length of antennas transmitting at different frequencies so that RF signals are transmitted at a maximized strength and higher radiation efficiency. The process 400 may be utilized in conjunction with the system 200 of FIG. 2A, and the process 450 may be utilized in conjunction with the system 270 of FIG. 2B, for example. By using the processes 400 and 450, one antenna may transmit an RF signal at a particular frequency, such as in a high frequency band (e.g., 2.4 GHz), and another antenna may transmit an RF signal at another frequency, such as in a low frequency band (e.g., UHF/VHF), at maximum radiated power. In some embodiments, the antenna transmitting the high frequency band RF signal may be tuned to transmit its RF signal during a preamble period of a digital transmission packet, and the antenna transmitting the low frequency band RF signal may be tuned to transmit its RF signal (e.g., an analog modulation RF signal) except during the preamble period of the digital transmission packet. In other embodiments, the low frequency band antenna may transmit an RF signal that is a digital modulation RF signal, and the high frequency band antenna may also transmit an RF signal that is a digital modulation RF signal. In this case, the low frequency band RF signal may be tuned during a preamble period of its digital modulation RF signal that is synchronized with the preamble period of the digital modulation RF signal of the high frequency band RF signal.

At step 402, an initial high frequency band RF signal may be generated, such as by an RF transceiver or transmitter. The initial high frequency band RF signal may contain monitoring and control signals, for example. The initial high frequency band RF signal may be amplified at step 404 to a high frequency band RF signal, such as with a power amplifier. The high frequency band RF signal may be transmitted from an antenna at step 406 so that the high frequency band RF signal can be received by a receiver component. At the same time or at a different time as steps 402 to 406, an initial low frequency band RF signal may be generated at step 408, such as by an RF transceiver or transmitter. The initial low frequency band RF signal may contain audio or data signals modulated by analog and/or digital modulation schemes, for example. The initial low frequency band RF signal may be amplified at step 410 to a low frequency band RF signal, such as with a power amplifier. The low frequency band RF signal may be transmitted from an antenna at step 412 so that the low frequency band RF signal can be received by a receiver component.

At step 414, the near field RF signals of the transmitted high frequency band RF signal and/or low frequency band RF signal may be detected by a sensing antenna, for example. Detecting the near field RF signals helps to determine the tuning of the antennas because there is a strong correlation between the strength of a near field RF signal and the strength of its associated far field RF signal. At step 416, it may be determined whether the preamble portion of a digital transmission packet is being transmitted on the high frequency band RF signal. If the preamble portion is being transmitted at step 416, then the processes 400 and 450 continue to step 418. At step 418, a filtered high frequency band near field RF signal may be generated from the high frequency band near field RF signal detected at step 414. The filtered high frequency band near field RF signal may be generated by a high frequency band band pass filter, for example, so that RF signals out of this frequency band being transmitted can be rejected.

At step 420, the filtered high frequency band near field RF signal may be converted to an RF strength control signal, such as by an RF detector. The RF strength control signal may represent the strength of the filtered high frequency band near field RF signal and may be a DC voltage or a digital signal (e.g., SPI, I$^2$C, etc.), for example. At step 422, an antenna tuning control signal may be generated based on the RF strength control signal. The antenna tuning control signal may be generated by routines executing on a processor, for example. In the process 400 shown in FIG. 4A, the antenna tuning control signal may control an antenna tuner at step 424 to control the electrical length of the transmitting antenna to maximize the strength of the transmitted high frequency band RF signal. This can be accomplished by antenna tuning, or by antenna selection if the high frequency band antenna has a multiple antenna configuration. Further description of generating the tuning control signal is discussed below with respect to FIG. 5. In the process 450 shown in FIG. 4B, following step 422, an RF switch may be controlled by the antenna tuning control signal at step 454 so that the best fixed antenna that is radiating the highest power during the preamble portion is selected for transmission.

If the preamble portion of a digital transmission packet is not being transmitted on the high frequency band RF signal at step 416, then the processes 400 and 450 continue to step 426. At step 426, a filtered low frequency band near field RF signal may be generated from the low frequency band near field RF signal detected at step 414. The filtered low frequency band near field RF signal may be generated by a low frequency band band pass filter, for example, so that RF signals out of this frequency band being transmitted can be rejected. At step 428, the filtered low frequency band near field RF signal may be converted to an RF strength control signal, such as by an RF detector. The RF strength control signal may represent the strength of the filtered low frequency band near field RF signal and may be a DC voltage or a digital signal (e.g., SPI, I$^2$C, etc.), for example. At step 430, an antenna tuning control signal may be generated based on the RF strength control signal. The antenna tuning control signal may be generated by routines executing on a processor, for example. The antenna tuning control signal may control an antenna tuner at step 432 to control the electrical length of the transmitting antenna to maximize the strength of the transmitted low frequency band RF signal.

Further description of generating the tuning control signal is discussed below with respect to FIG. 5.

Figure 5:
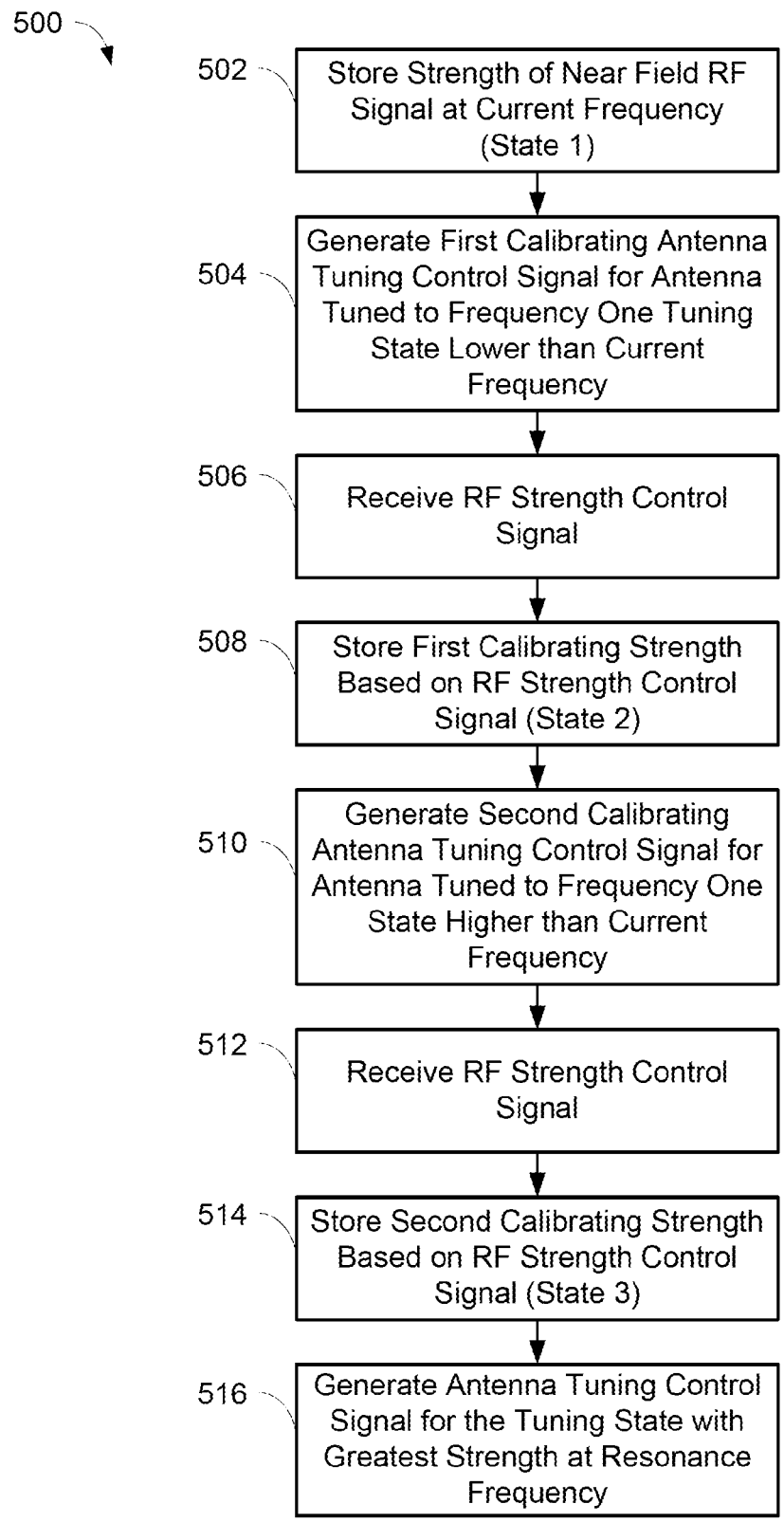
FIG. 5 is a flowchart illustrating operations for generating an antenna tuning control signal in conjunction with the operation of FIGS. 3 and 4A-4B, in accordance with some embodiments.

An embodiment of a process 500 for generating an antenna tuning control signal is shown in FIG. 5. The process 500 may be an embodiment of steps 314, 422, and/or 430, as described above, for example. The antenna tuning control signal may be generated based on the measured strength of a detected near field RF signal so that a particular antenna is tuned to maximize the strength of an RF signal transmitted by the antenna. The process 500 may be performed by a processor, for example. At step 502, a strength of the near field RF signal at the current transmitted frequency can be stored in a memory, for example. The strength of the near field RF signal may be based on an RF strength control signal generated by an RF detector, as described above, for example. At step 504, a first calibrating antenna tuning control signal may be generated so that the antenna is tuned to a frequency one tuning state lower than the current frequency. An RF strength control signal signifying the strength of a near field RF signal at this state may be received at step 506. A first calibrating strength may be stored in a memory at step 508. The first calibrating strength may be based on the RF strength control signal received at step 506.

At step 510, a second calibrating antenna tuning control signal may be generated so that the antenna is tuned to a frequency one tuning state higher than the current frequency. An RF strength control signal signifying the strength of a near field RF signal at this state may be received at step 512. A second calibrating strength may be stored in a memory at step 514. The second calibrating strength may be based on the RF strength control signal received at step 512. At step 516, the antenna tuning control signal may be generated so that the antenna is tuned to the tuning state having the highest measured strength for the near field RF signal. The strength stored at step 502, the first calibrating strength stored at step 508, and the second calibrating strength stored at step 514 may be compared to one another to determine the highest measured strength. The antenna calibration tuning state corresponding to the highest measured near field strength (out of the three tuning states) may then be tuned to at step 516. In this way, the antenna may be continuously adapted and self-tuned so that it is transmitting at the maximum power. The calibration state repetition periods and step sizes may be configured and optimized depending on the particular protocols of the wireless system and the propagation profile.

Figure 8:
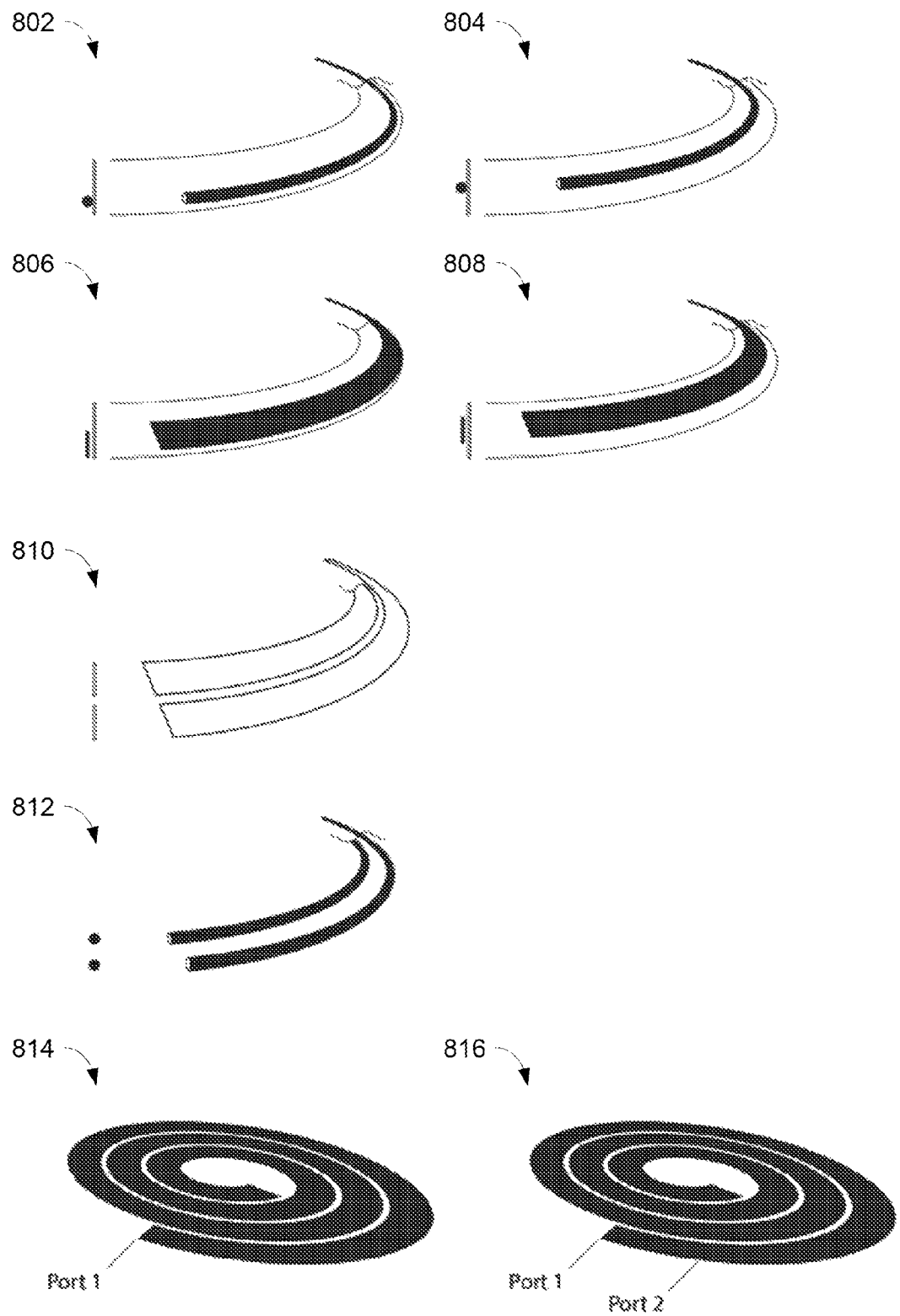
FIG. 8 show exemplary representations of antennas.

FIG. 8 illustrates exemplary representations of antennas, including antennas with dual helical branches. The antennas shown in FIG. 8 can transmit an RF signal that contains audio or data signals modulated by analog and/or digital modulation schemes, for example. The signals may have been modulated by an RF transceiver/transmitter and amplified by a power amplifier, in some embodiments. The RF transceiver/transmitter may be in communication with other components (not shown), such as a microphone or playback device, with digital data signals, control signals, etc. The antennas shown in FIG. 8 are exemplary embodiments of an antenna that could be used in the systems 100 and 200 described above. A ground plane of the antennas may include electronic and mechanical components of the device (e.g., printed circuit board copper grounding, RF shielding, battery, etc.), and/or a person holding the device, for example.

The antennas 802, 804, 806, 808, 810, and 812 shown in FIG. 8 may include dual helical branches. The helical branches may be conformingly constructed on a substrate, such as on a plastic enclosure of a device, e.g., a wireless audio transmitter or other portable wireless communications device. Laser direct structuring on injection molded plastic parts may be utilized to print the helical branches on the plastic enclosure, for example. In this way, the antennas 802, 804, 806, 808, 810, and 812 may be integrated within the device and be protected from potential damage due to physical interaction with a user or other objects.

The helical branches may be composed of conductors, such as wires or plated conductors. In FIG. 8, a portion of each of the antennas 802, 804, 806, 808, 810, and 812 is shown in a three dimensional view, and a cross section of each of the antennas is also shown to the left of each antenna to show the spatial positioning of the conductors. In particular, the antennas 802 and 804 show that the helical branches include a conductor strip and a wire. The wires in the antennas 802 and 804 are in a bottom orientation and a middle orientation, respectively. The antennas 806 and 808 show that the helical branches include a wide conductor strip and a narrower conductor strip. The narrower conductor strip in the antennas 806 and 808 are in a bottom orientation and a middle orientation, respectively. The antenna 810 shows that the helical branches include two conductor strips. The antenna 812 shows that the helical branches include two wires. The helical branches are not electrically connected to one another, and may have different geometries and/or physical lengths.

The antennas 814 and 816 include a three-dimensional single spiral that may be a conductor strip or a wire. In the antenna 814, a single port feed may be included for receiving or transmitting of the RF signal being fed to Port 1. A dual port feed may be included for receiving or transmitting the RF signal being fed to Port 2 with Port 1 connected to ground, as shown in the antenna 816. The antennas 814 and 816 may be conformingly constructed on a substrate, such as on a plastic enclosure of a device and have different shapes and form factors. The antennas 814 and 816 may be integrated within the device and be protected from potential damage due to physical interaction with a user or other objects.

An antenna or each of the branches of an antenna can be connected to a tuning network that tunes the antenna to resonance and improves the radiation efficiency of the antenna. The tuning network may include inductors, digitally tunable capacitors, microelectromechanical (MEMS) capacitors, and/or PIN diodes, as described above, to allow the tuning of the antenna to control its electrical length and maximize the transmission strength of an RF signal.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. An adaptive self-tunable antenna system, comprising:
a sensing antenna for detecting a near field radio frequency (RF) signal of an RF signal transmitted from a transmitting antenna, the RF signal comprising one or more of an analog modulated signal or a digital modulated signal;
a band pass filter in communication with the sensing antenna, the band pass filter for generating a filtered near field RF signal from the near field RF signal;
an RF detector in communication with the band pass filter, the RF detector for detecting a power of the filtered near field RF signal and outputting an RF strength control signal representing a strength of the filtered near field RF signal; and
a processor in communication with the RF detector, the processor configured to receive the RF strength control signal and generate an antenna tuning control signal based on the RF strength control signal, wherein the antenna tuning control signal is for controlling an electrical length of the transmitting antenna such that a strength of the RF signal transmitted by the transmitting antenna is maximized, wherein the processor is configured to generate the antenna tuning control signal by:
storing the strength of the RF signal at a current frequency, based on the RF strength control signal;
generating a first calibrating antenna tuning control signal such that the transmitting antenna is tuned to a first frequency one tuning state lower than the current frequency of the RF signal;
receiving the RF strength control signal;
storing a first calibrating strength of the RF signal based on the RF strength control signal;
generating a second calibrating tuning control signal such that the transmitting antenna is tuned to a second frequency that is one tuning state higher than the current frequency of the RF signal;
receiving the RF strength control signal;
storing a second calibrating strength of the RF signal based on the RF strength control signal; and
generating the antenna tuning control signal such that the transmitting antenna is tuned to a resonance at one of the first frequency, the second frequency, or the current frequency based on the greater of the first calibrating strength, the second calibrating strength, and the strength of the RF signal.

2. The adaptive self-tunable antenna system of claim 1, further comprising:
the transmitting antenna for transmitting the RF signal;
an antenna tuner in communication with the processor and the transmitting antenna, the antenna tuner configured to control the electrical length of the transmitting antenna based on the antenna tuning control signal;
an RF transmitter for generating an initial RF signal comprising the one or more of the analog modulated signal or the digital modulated signal; and
an RF power amplifier in communication with the RF transmitter and the antenna tuner, the RF power amplifier for amplifying the initial RF signal to the RF signal and transmitting the RF signal to the antenna tuner.

3. The adaptive self-tunable antenna system of claim 2, wherein the antenna tuner comprises a phase shifter.

4. The adaptive self-tunable antenna system of claim 3, wherein:

the phase shifter comprises at least one inductor in series with at least one capacitor and the transmitting antenna; and
a capacitance value of the at least one capacitor is selected based on the antenna tuning control signal, wherein the selected capacitance value controls the electrical length of the transmitting antenna.

5. The adaptive self-tunable antenna system of claim 4, wherein the at least one capacitor comprises one or more of at least one digitally tunable capacitor or at least one microelectromechanical capacitor.

6. The adaptive self-tunable antenna system of claim 3, wherein:
the phase shifter comprises at least one inductor in series with at least one varactor diode and the transmitting antenna; and
a capacitance value of the at least one varactor diode is determined based on the antenna tuning control signal, wherein the selected capacitance value controls the electrical length of the transmitting antenna.

7. The adaptive self-tunable antenna system of claim 3, wherein:
the phase shifter comprises at least one PIN diode in communication with the transmitting antenna; and
the at least one PIN diode is biased based on the antenna tuning control signal, wherein the biasing of the at least one PIN diode controls the electrical length of the transmitting antenna.

8. The adaptive self-tunable antenna system of claim 3, wherein the phase shifter comprises one or more of a balanced phase shifter or a single ended phase shifter.

9. The adaptive self-tunable antenna system of claim 2, wherein the transmitting antenna comprises a first helical branch and a second helical branch, the first helical branch and the second helical branch disposed parallel to one another and not electrically connected to one another.

10. The adaptive self-tunable antenna system of claim 9, wherein:
the first helical branch has a first length; and
the second helical branch has a second length different from the first length.

11. The adaptive self-tunable antenna system of claim 9, wherein:
the first helical branch has a first geometry; and
the second helical branch has a second geometry different from the first geometry.

12. The adaptive self-tunable antenna system of claim 2, wherein the transmitting antenna comprises a single helical branch.

13. The adaptive self-tunable antenna system of claim 1, wherein the sensing antenna comprises one or more of a trace on a printed circuit board or a broadband antenna.

14. The adaptive self-tunable antenna system of claim 1, wherein the RF signal contains one or more of an audio signal or a data signal.

15. A method for adaptively self-tuning a transmitting antenna, comprising:
detecting a near field radio frequency (RF) signal of an RF signal transmitted from the transmitting antenna, the RF signal comprising one or more of an analog modulated signal or a digital modulated signal;
band pass filtering the near field RF signal to generate a filtered near field RF signal from the near field RF signal;
detecting a power of the filtered near field RF signal and outputting an RF strength control signal representing a strength of the filtered near field RF signal; and generating an antenna tuning control signal based on the RF strength control signal, wherein the antenna tuning control signal is for controlling an electrical length of the transmitting antenna such that a strength of the RF signal transmitted by the transmitting antenna is maximized, wherein generating the antenna tuning control signal comprises:

storing the strength of the RF signal at a current frequency, based on the RF strength control signal;
generating a first calibrating antenna tuning control signal such that the transmitting antenna is tuned to a first frequency one tuning state lower than the current frequency of the RF signal;
receiving the RF strength control signal;
storing a first calibrating strength of the RF signal based on the RF strength control signal;
generating a second calibrating tuning control signal such that the transmitting antenna is tuned to a second frequency that is one tuning state higher than the current frequency of the RF signal;
receiving the RF strength control signal;
storing a second calibrating strength of the RF signal based on the RF strength control signal; and
generating the antenna tuning control signal such that the transmitting antenna is tuned to a resonance at one of the first frequency, the second frequency, or the current frequency based on the greater of the first calibrating strength, the second calibrating strength, and the strength of the RF signal.

16. The method of claim 15, further comprising:
generating an initial RF signal comprising the one or more of the analog modulated signal or the digital modulated signal;
amplifying the initial RF signal to the RF signal;
transmitting the RF signal from the transmitting antenna; and
controlling the electrical length of the transmitting antenna based on the antenna tuning control signal.

17. The method of claim 16, wherein controlling the electrical length of the transmitting antenna comprises selecting a capacitance value of at least one capacitor based on the antenna tuning control signal, wherein the selected capacitance value controls the electrical length of the transmitting antenna and the at least one capacitor is in series with at least one inductor and the transmitting antenna.

18. The method of claim 17, wherein the at least one capacitor comprises one or more of at least one digitally tunable capacitor or at least one microelectromechanical capacitor.

19. The method of claim 16, wherein controlling the electrical length of the transmitting antenna comprises determining a capacitance value of at least one varactor diode based on the antenna tuning control signal, wherein the selected capacitance value controls the electrical length of the transmitting antenna and the at least one varactor diode is in series with at least one inductor and the transmitting antenna.

20. The method of claim 16, wherein controlling the electrical length of the transmitting antenna comprises biasing at least one PIN diode based on the antenna tuning control signal, wherein the biasing of the at least one PIN diode controls the electrical length of the transmitting antenna and the at least one PIN diode is in communication with the transmitting antenna.

21. The method of claim 15, wherein the transmitting antenna comprises a first helical branch and a second helical branch, the first helical branch and the second helical branch disposed parallel to one another and not electrically connected to one another.

22. The method of claim 21, wherein:
the first helical branch has a first length; and
the second helical branch has a second length different from the first length.

23. The method of claim 21, wherein:
the first helical branch has a first geometry; and
the second helical branch has a second geometry different from the first geometry.

24. The method of claim 15, wherein the transmitting antenna comprises a single helical branch.

25. An adaptive self-tunable antenna system, comprising:
a sensing antenna for detecting a first near field radio frequency (RF) signal of a first RF signal transmitted from a first transmitting antenna, and a second near field RF signal of a second RF signal transmitted from a second transmitting antenna, wherein the first RF signal is a first frequency and the second RF signal is at a second frequency different from the first frequency;
a first RF switch in communication with the sensing antenna, the first RF switch for conveying a selected near field RF signal from the first near field RF signal or the second near field RF signal, based on whether the first RF signal or the second RF signal is to be transmitted;
a first band pass filter in communication with the first RF switch, the first band pass filter for generating a first filtered near field RF signal from the first near field RF signal;
a second band pass filter in communication with the first RF switch, the second band pass filter for generating a second filtered near field RF signal from the second near field RF signal;
a second RF switch in communication with the first and second band pass filters, the second RF switch for conveying a selected filtered near field RF signal from the first filtered near field RF signal or the second filtered near field RF signal, based on whether the first RF signal or the second RF signal is to be transmitted;
an RF detector in communication with the second RF switch, the RF detector for detecting a power of the selected filtered near field RF signal and outputting a RF strength control signal representing a strength of the selected filtered near field RF signal; and
a processor in communication with the RF detector, the processor configured to receive the RF strength control signal and generate an antenna tuning control signal based on the RF strength control signal, wherein the antenna tuning control signal is for controlling a respective electrical length of the first or second transmitting antenna such that a strength of the first or second RF signal transmitted by the first or second transmitting antenna is maximized, wherein the processor is configured to generate the antenna tuning control signal by:
storing the strength of a transmitted RF signal at a current frequency, based on the RF strength control signal, wherein the transmitted RF signal comprises: (1) the first RF signal if the first RF signal is to be transmitted or (2) the second RF signal if the second RF signal is to be transmitted;
generating a first calibrating antenna tuning control signal such that a transmitting antenna is tuned to a first frequency one tuning state lower than the current frequency of the transmitted RF signal, wherein the transmitting antenna comprises (1) the first transmitting antenna if the first RF signal is to be transmitted or (2) the second transmitting antenna if the second RF signal is to be transmitted;
receiving the RF strength control signal;
storing a first calibrating strength of the transmitted RF signal based on the RF strength control signal;
generating a second calibrating tuning control signal such that the transmitting antenna is tuned to a second frequency that is one tuning state higher than the current frequency of the transmitted RF signal;
receiving the RF strength control signal;
storing a second calibrating strength of the transmitted RF signal based on the RF strength control signal; and
generating the antenna tuning control signal such that the transmitting antenna is tuned to a resonance at one of the first frequency, the second frequency, or the current frequency based on the greater of the first calibrating strength, the second calibrating strength, and the strength of the transmitted RF signal.

26. The adaptive self-tunable antenna system of claim 25, further comprising:
a first antenna tuner in communication with the processor and the first transmitting antenna, the first antenna tuner configured to control the first electrical length of the first transmitting antenna based on the antenna tuning control signal; and
a second antenna tuner in communication with the processor and the second transmitting antenna, the second antenna tuner configured to control the second electrical length of the second transmitting antenna based on the antenna tuning control signal.

27. The adaptive self-tunable antenna system of claim 25, wherein:
the first frequency is in a high frequency band;
the first RF signal is a first digital modulated signal;
the second frequency is in a low frequency band; and
the second RF signal is one or more of an analog modulated signal or a second digital modulated signal.

28. The adaptive self-tunable antenna system of claim 27, wherein:
if a preamble of the first digital modulated signal is being transmitted:
the selected near field RF signal conveyed by the first RF switch is the first near field RF signal; and
the selected filtered near field RF signal conveyed by the second RF switch is the first filtered near field RF signal; and
if the preamble of the first digital modulated signal is not being transmitted:
the selected near field RF signal conveyed by the first RF switch is the second near field RF signal; and
the selected filtered near field RF signal conveyed by the second RF switch is the second filtered near field RF signal.

* * * * *